US011862942B2

(12) United States Patent
Shirazi Hosseini Dokht et al.

(10) Patent No.: US 11,862,942 B2
(45) Date of Patent: Jan. 2, 2024

(54) VERTICAL-CAVITY SURFACE-EMITTING LASER ARRAY WITH A TILTED EMITTER PATTERN

(71) Applicant: Lumentum Operations LLC, San Jose, CA (US)

(72) Inventors: Mohammad Ali Shirazi Hosseini Dokht, Milpitas, CA (US); Matthew Glenn Peters, Menlo Park, CA (US); John Michael Miller, Gatineau (CA)

(73) Assignee: Lumentum Operations LLC, San Jose, CA (US)

( * ) Notice: Subject to any disclaimer, the term of this patent is extended or adjusted under 35 U.S.C. 154(b) by 417 days.

(21) Appl. No.: 16/948,700

(22) Filed: Sep. 29, 2020

(65) Prior Publication Data

US 2021/0399530 A1    Dec. 23, 2021

Related U.S. Application Data

(60) Provisional application No. 63/041,427, filed on Jun. 19, 2020.

(51) Int. Cl.
*H01S 5/42* (2006.01)
*G02B 27/42* (2006.01)
*G02B 27/30* (2006.01)

(52) U.S. Cl.
CPC .............. *H01S 5/423* (2013.01); *G02B 27/30* (2013.01); *G02B 27/425* (2013.01)

(58) Field of Classification Search
CPC ........ G02B 27/30; G02B 27/46; G02B 27/42; G02B 27/425; G02B 24/4205; G02B 27/48; G02B 27/12; G02B 27/126; G02B 27/1093; G02B 27/20; G02B 3/00; G02B 3/0037; G02B 11/2513; G03B 21/28; G03B 21/2033; G03B 21/142; H01S 5/42; H01S 5/423; H01S 5/426; H01S 5/005
USPC .... 359/566, 564, 443, 457; 272/50.1, 50.12, 272/50.121, 50.122, 50.124, 23, 101
See application file for complete search history.

(56) References Cited

U.S. PATENT DOCUMENTS 9,946,089 B2 * 4/2018 Chen ................. G03B 21/2033

* cited by examiner

*Primary Examiner* — Jie Lei
(74) *Attorney, Agent, or Firm* — Harrity & Harrity, LLP (57) ABSTRACT

A VCSEL array may include a semiconductor substrate and a plurality of emitters on the substrate that conforms to an emitter pattern. The emitter pattern may be oriented at a non-zero angle to an edge of the substrate and may comprise two or more unit cells arranged to form the emitter pattern. Each unit cell, of the two or more unit cells, may include a same number of emitters, and the two or more unit cells may be arranged to cause a measurement of misalignment associated with two adjacent unit cells, of the two or more unit cells, to satisfy a misalignment threshold.

20 Claims, 9 Drawing Sheets

| m·dx \ n·dy | 0 | 1 84.663895 | 2 169.32779 | 3 253.99169 | 4 338.65558 | 5 423.31948 | 6 507.98337 | 7 592.64727 |
|---|---|---|---|---|---|---|---|---|
| 1 | 146.6422 | 14 | 28 | 42 | 56 | 70 | 84 | 98 |
| 2 | 293.2843 | 28 | 56 | 84 | 112 | 140 | 168 | 196 |
| 3 | 439.9265 | 42 | 84 | 126 | 168 | 210 | 252 | 294 |
| 4 | 586.5687 | 56 | 112 | 168 | 224 | 280 | 336 | 392 |
| 5 | 733.2108 | 70 | 140 | 210 | 280 | 350 | 420 | 490 |
| 6 | 879.853 | 84 | 168 | 252 | 336 | 420 | 504 | 588 |
| 7 | 1026.495 | 98 | 196 | 294 | 392 | 490 | 588 | 686 |
| 8 | 1173.137 | 112 | 224 | 336 | 448 | 560 | 672 | 784 |
| 9 | 1319.78 | 126 | 252 | 378 | 504 | 630 | 756 | 882 |
| 10 | 1466.422 | 140 | 280 | 420 | 560 | 700 | 840 | 980 |

|  | x | y | Aspect ratio | pitch |
|---|---|---|---|---|
| From | 439.9265 | 423.31948 | 1.0392305 | 32 |
| Scaled | 394.9165 | 380.0086 | 1.0392305 | 28.726 |
| Stretch | 422 | 380 | 1.1105263 |  |

|  |  | Stretch to % |  | angle | 10.955 |
|---|---|---|---|---|---|
| Angle | 11 | Stretch x | 1.0685803 | Pitch_a | 30.627 |
| Pitch | 28.726 | Stretch y | 1 | Pitch_b | 28.941 |
| Number of emitters | same |  |  |  |  |

VERTICAL-CAVITY SURFACE-EMITTING LASER ARRAY WITH A TILTED EMITTER PATTERN

RELATED APPLICATION

This application claims priority to U.S. Provisional Patent Application No. 63/041,427, filed on Jun. 19, 2020, and entitled "VERTICAL-CAVITY SURFACE-EMITTING LASER DESIGN FOR DOT PROJECTION," the content of which is incorporated by reference herein in its entirety.

TECHNICAL FIELD

The present disclosure relates generally to a vertical-cavity surface-emitting laser (VCSEL) array and to a VCSEL array with a tilted emitter pattern.

BACKGROUND

A structured light system may include an emitter array (e.g., a vertical-cavity surface-emitting laser (VCSEL) array), a lens, and a diffractive optical element (DOE). In operation, light emitted by emitters of the emitter array is collimated by the lens, and beams of collimated light (each corresponding to a respective emitter) are directed to the DOE. The DOE distributes the collimated beams of light in order to create a dot projection (e.g., a projection of the collimated beams). More specifically, the DOE diffracts a given beam of light such that diffracted orders of the given beam are transmitted by the DOE at different angles. An angular extent of the diffraction occurs over a range of angles relative to a surface of the DOE referred to as a field of view (FOV). The FOV can be, for example, a 60 degree FOV, a 90 degree FOV, or the like. These differently directed diffracted orders form a dot projection (e.g., that includes tens of thousands of spots) in the FOV.

SUMMARY

In some implementations, a VCSEL array includes a semiconductor substrate; a plurality of emitters on the substrate that conforms to an emitter pattern, wherein the emitter pattern is oriented at a non-zero angle to an edge of the substrate, wherein the emitter pattern comprises two or more unit cells arranged to form the emitter pattern, wherein each unit cell, of the two or more unit cells, includes a same number of emitters, and wherein the two or more unit cells are arranged to cause a measurement of misalignment associated with two adjacent unit cells, of the two or more unit cells, to satisfy a misalignment threshold.

In some implementations, a structured light system includes a VCSEL array that comprises: a plurality of emitters that conforms to an emitter pattern, wherein the emitter pattern is oriented at a non-zero angle to a rectilinear axis of a DOE, wherein the emitter pattern comprises two or more unit cells arranged to form the emitter pattern, wherein each unit cell, of the two or more unit cells, includes a same number of emitters, and wherein the two or more unit cells are arranged to cause a measurement of unit cell misalignment associated with two adjacent unit cells, of the two or more unit cells, to satisfy a unit cell misalignment threshold; and the DOE, configured to generate a dot projection from light emitted by the plurality of emitters of the VCSEL array, wherein the dot projection comprises a plurality of tiles.

In some implementations, a structured light system includes a VCSEL array that comprises a plurality of emitters that conforms to an emitter pattern, wherein the emitter pattern is oriented at a non-zero angle to a rectilinear axis of a DOE, wherein the emitter pattern comprises one or more unit cells arranged to form the emitter pattern; and the DOE, configured to generate a dot projection from light emitted by the plurality of emitters of the VCSEL array, wherein the dot projection comprises a plurality of tiles, and wherein the plurality of tiles are arranged to cause a measurement of tile misalignment to satisfy a tile misalignment threshold.

DETAILED DESCRIPTION

The following detailed description of example implementations refers to the accompanying drawings. The same reference numbers in different drawings may identify the same or similar elements.

An indirect-time-of-flight (iToF) measurement system may include a structured light device (e.g., that includes an emitter array, such as VCSEL array; a lens; a DOE; and/or the like) for projecting dots onto a target (e.g., a screen, a face, a scene, and/or the like) to allow the iToF measurement system to measure the target. Typically, features of the DOE are formed along rectilinear axes of the DOE that are perpendicular to an optical axis of the lens and/or the DOE. Typically, a VCSEL array of the structured light device includes a plurality of emitters that conforms to an emitter pattern, which is positioned along an optical axis of the lens and/or the DOE of the structured light device. Typically, the emitter pattern is oriented parallel to an edge of a chip of the VCSEL, which is oriented parallel to one of the rectilinear axes of the DOE. This may produce a homogeneous dot projection on the target (e.g., many dots of the dot projection may be vertically or horizontally aligned), which may prevent the iToF measurement system from obtaining an accurate measurement of the target. Moreover, in some cases, the emitter pattern of the VCSEL array may be horizontally or vertically aligned parallel to an edge of a chip of the VCSEL array, which may allow crystal plane defects (e.g., that typically run vertically or horizontally along the chip) of the chip to easily propagate to sets of emitters of the emitter pattern. This may cause some emitters to fail and therefore negatively impact a performance of the VCSEL array.

Some implementations described herein provide a VCSEL array that includes a plurality of emitters that conforms to an emitter pattern that is oriented at a non-zero angle (e.g., between 1 and 45 degrees, between 5 and 20 degrees, and/or between 9 and 13 degrees, among other examples) to a rectilinear axis of an associated DOE and/or to a reference edge of a chip of the VCSEL array (e.g., a semiconductor substrate of the VCSEL on which the plurality of emitters are formed). The emitter pattern may comprise one or more unit cells (e.g., that act as fundamental units of the emitter pattern) that may be arranged to form the emitter pattern (e.g., placed side-by-side in m rows and n columns, where m and n are greater than or equal to 1). Each unit cell, when the emitter pattern comprises two or more unit cells, may include a same number of emitters, and the two or more unit cells may be arranged to minimize an amount of misalignment between adjacent unit cells (e.g., in an x-direction and/or a y-direction).

In some implementations, the DOE may generate a dot projection from light emitted by the plurality of emitters of the VCSEL array. The dot projection may comprise a plurality of tiles, wherein each tile comprises a plurality of dots that conforms to a dot pattern that corresponds to the emitter pattern (e.g., a dot of the dot pattern is respectively associated with an emitter of the emitter pattern). The DOE may be configured such that the plurality of tiles are arranged to minimize an amount of misalignment between adjacent tiles (e.g., in the x-direction and/or the y-direction).

In this way, some implementations described herein allow a DOE to generate an aligned and/or consistently spaced dot projection from light produced by a VCSEL array with an emitter pattern with a non-zero tilt angle (e.g. in relation to a rectilinear axis of the DOE and/or to a reference edge of the VCSEL chip). Accordingly, the dot projection generated in some implementations described herein is more heterogeneous than that produced using a conventional VCSEL array without a non-zero tilt angle (e.g., few dots of the dot projection are vertically or horizontally aligned), which allows an iToF measurement system that includes the VCSEL array and/or the DOE described herein to obtain a more accurate measurement of a target. Moreover, by using an emitter pattern with a non-zero tilt angle (e.g. in relation to a rectilinear axis of the DOE and/or to a reference edge of the VCSEL chip), the emitter pattern is not horizontally or vertically aligned with a reference edge of a chip of the VCSEL array, which reduces a likelihood that crystal plane defects will propagate to sets of emitters of the emitter pattern. Accordingly, this prevents some emitters from failing and therefore improves a performance of the VCSEL array and/or improves a robustness of the VCSEL array.

Figure 1A:
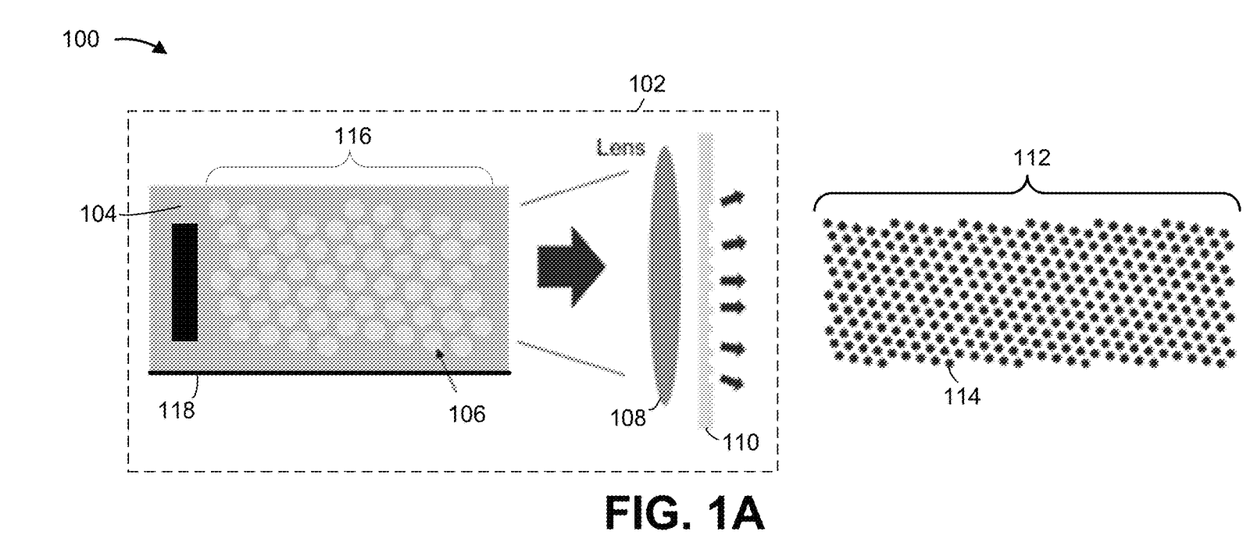
FIGS. 1A-1B are diagrams of an example implementation described herein.
Figure 1B:
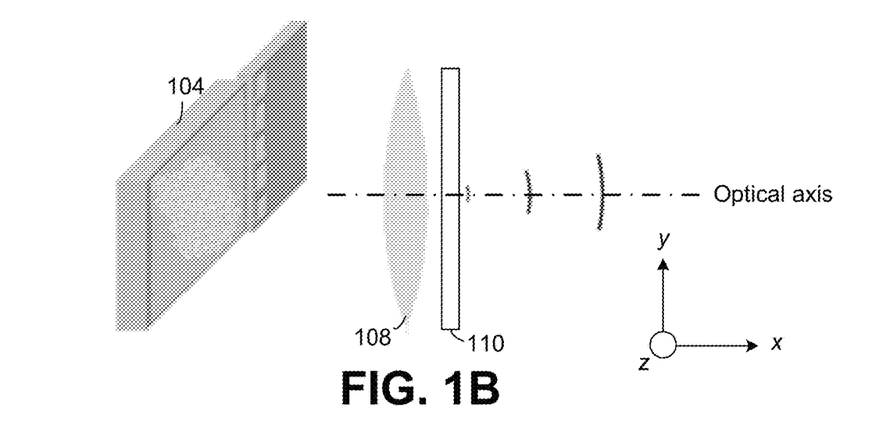

FIGS. 1A-1B are diagrams of an example implementation 100 described herein. As shown in FIG. 1A, a structured light device 102 may include a VCSEL array 104 that includes a plurality of emitters 106 (e.g., in a chip of the VCSEL array 104), a lens 108, and/or a diffractive optical element (DOE) 110 (shown as a diffraction grating). The structured light device 102 may be configured to emit a dot projection 112 comprising a plurality of dots 114. For example, the plurality of emitters 106 of the VCSEL array 104 may be configured to emit light, the lens 108 may be configured to collimate the light and/or direct the light to the DOE 110, and the DOE 110 may be configured to generate the dot projection 112 across a scene (e.g., a target, an object, and/or the like).

As shown in FIGS. 1A and 1B, the plurality of emitters 106 may conform to an emitter pattern 116. As shown in FIGS. 1A and 1B, the emitter pattern 116 may be oriented at an angle to a rectilinear axis of the DOE 110 (e.g., shown in FIG. 1B as either the y- or z-axis) and/or to a reference edge 118 of the VCSEL chip (e.g., at a non-zero angle). The orientation of the emitter pattern 116 is further described herein. As shown in FIG. 1A, the dot projection 112 may be a repeated optical copy of the emitter pattern 116 tiled together. The composition of the dot projection 112 is further described herein.

As indicated above, FIGS. 1A-1B are provided as an example. Other examples may differ from what is described with regard to FIGS. 1A-1B.

Figure 2:
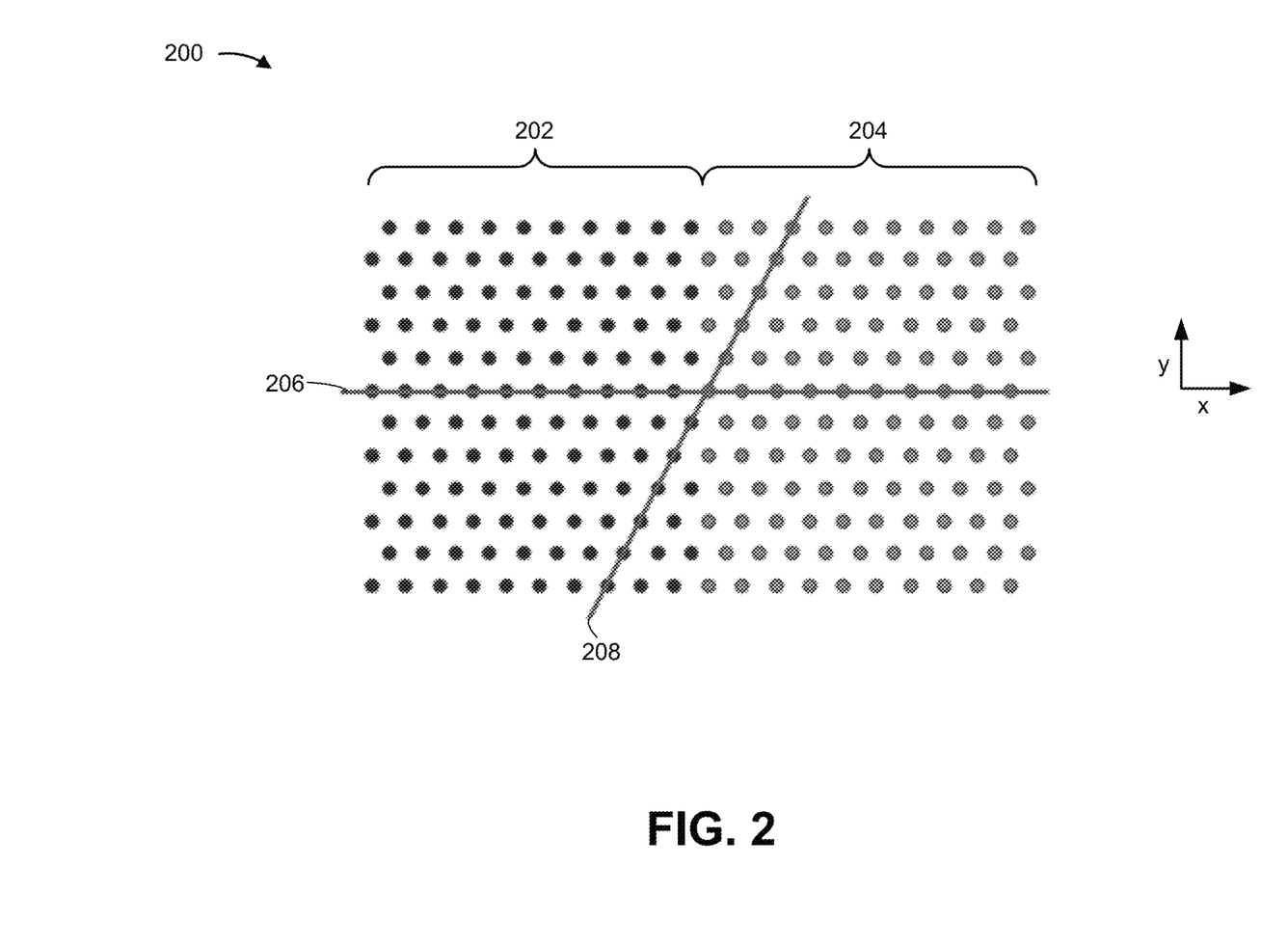
FIG. 2 is a diagram of an example dot projection associated with a conventional VCSEL array of a structured light device, wherein an emitter pattern of the conventional VCSEL array does not have a tilt angle.

FIG. 2 is a diagram of an example dot projection 200 associated with a conventional 120-emitter VCSEL array (e.g., a 12×10 emitter hexagonal array) of a structured light device, wherein an emitter pattern of the conventional 120-emitter VCSEL array has a zero-degree tilt angle (e.g., the emitter pattern is aligned with a rectilinear axis of a DOE of the structured light device and/or a reference edge of a chip of the VCSEL array). As shown in FIG. 2, a first tile 202 of the example dot projection 200 (e.g., the darker dots of the example dot projection 200) may be a first optical projection of the emitter pattern, and a second tile 204 of the example dot projection 200 (e.g., the lighter dots of the example dot projection 200) may be a second optical projection of the emitter pattern. As shown in FIG. 2, the first tile 202 of the example dot projection 200 may be tiled adjacent to the second tile 204 of the example dot projection 200 (e.g., projected next to each other to form a 1×2 tile pattern). As shown by line 206 and line 208, respectively passing through a plurality of dots of the first tile 202 of the example dot projection 200 and a plurality of dots of the second tile 204 of the example dot projection, the first tile 202 and the second tile 204 of the example dot projection 200 are aligned (e.g., a spacing associated with the dots of the example dot projection 200 is uniform and/or consistent throughout the example dot projection 200). Accordingly, FIG. 2 illustrates the ease of replicating an array when there is a zero tilt angle.

As indicated above, FIG. 2 is provided as an example. Other examples may differ from what is described with regard to FIG. 2.

Figure 3:
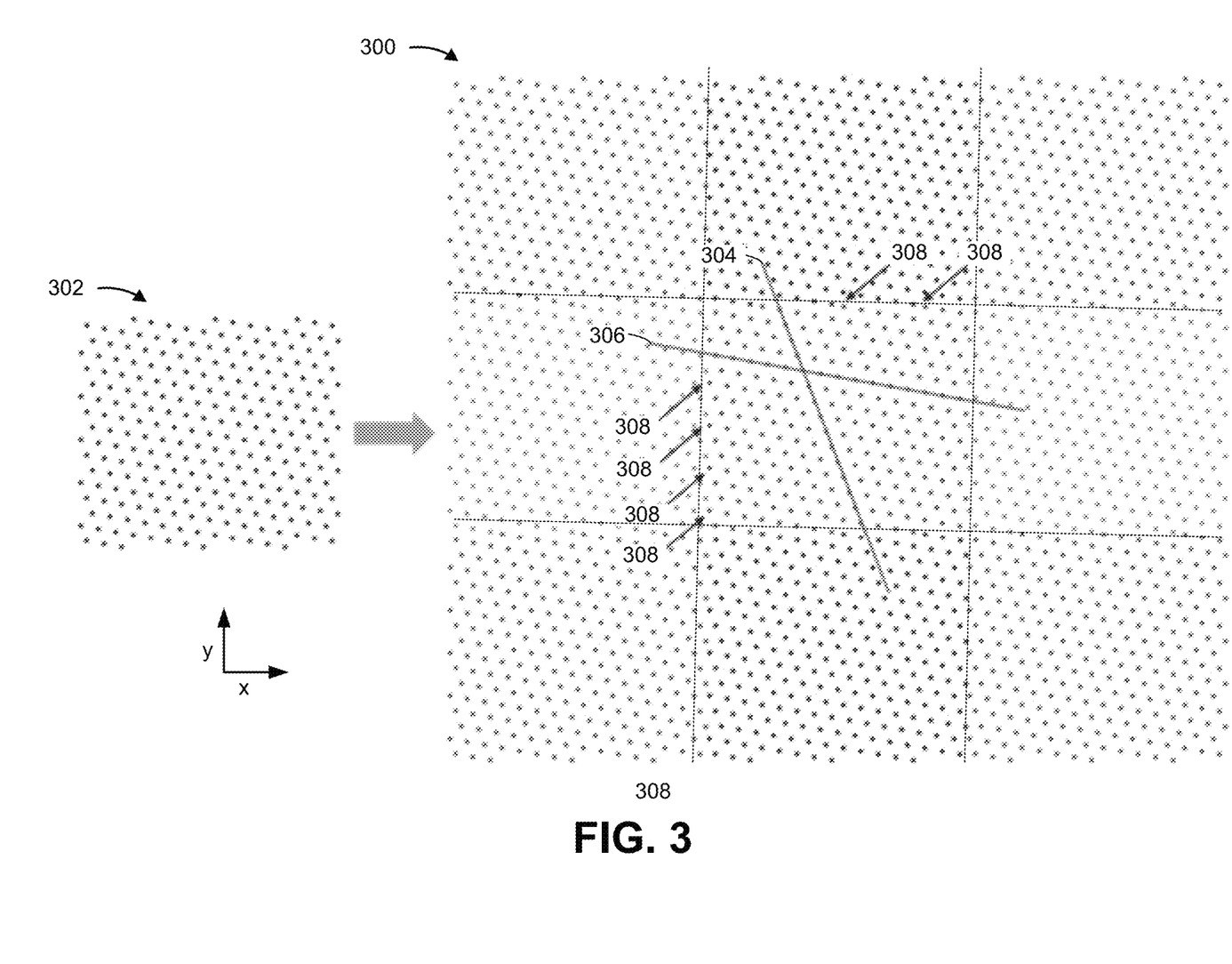
FIG. 3 is a diagram of an example dot projection associated with a conventional VCSEL array of a structured light device, wherein an emitter pattern of the conventional VCSEL array has a tilt angle.

FIG. 3 is a diagram of an example dot projection 300 associated with a conventional 240-emitter VCSEL array of a structured light device, wherein an emitter pattern 302 of the conventional 240-emitter VCSEL array has an eleven degree tilt (e.g., the emitter pattern is oriented at eleven degrees to a rectilinear axis of a DOE of the conventional structured light device). As shown in FIG. 3, the example dot projection 300 is a 3×3 optical projection of the emitter pattern 302 (e.g., the emitter pattern may be optically projected to form nine tiles, identified by dashed lines, arranged in a three row and three column tile pattern).

However, because of the eleven degree tilt, dots in a middle tile of the example dot projection 300 are not aligned with dots in adjacent tiles of the middle tile. For example, as shown by line 304, dots from tiles that are above and below the middle tile are not aligned with dots from the middle tile. As another example, as shown by line 306, dots from tiles that are to the left and right of the middle tile are not aligned with dots from the middle tile. Moreover, as shown by arrows 308, dots from an edge of the middle tile may not have a uniform and/or consistent spacing from dots of adjacent tiles.

Accordingly, due to misalignment and spacing issues when using a conventional VCSEL array with a non-zero tilt angle, some implementations described herein provide a VCSEL array with an emitter pattern that has a non-zero tilt angle and that emits light that can be projected (e.g., by a lens and/or DOE) into an aligned and/or consistently spaced dot projection. Additionally, some implementations described herein provide a method for designing such a VCSEL array with an emitter pattern that has a non-zero tilt.

As indicated above, FIG. 3 is provided as an example. Other examples may differ from what is described with regard to FIG. 3.

FIGS. 4A-4D are diagrams of an example implementation 400 related to designing an emitter pattern (e.g., the emitter pattern 116 shown in FIG. 1) that has a tilt angle (e.g., oriented at a non-zero angle) for a VCSEL array (e.g., the VCSEL array 104 or another VCSEL array) described herein that can be used in a structured light device (e.g., the structured light device 102 that includes the lens 108 and/or the DOE 110) to emit a dot projection (e.g., the example dot projection 112) comprising a plurality of tiles, wherein dots of the dot projection are aligned and/or consistently spaced.

In some implementations, a user device may be used to design the emitter pattern. In some implementations, the user device may include a communication device and/or a computing device. For example, the user device may include a wireless communication device, a mobile phone (e.g., a smart phone or a cell phone, among other examples), a laptop computer, a tablet computer, a handheld computer, a desktop computer, or a similar type of device. The user device may include a processor, such as a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. The processor may be implemented in hardware, firmware, and/or a combination of hardware and software. The user device may include one or more processors capable of being programmed to perform a function. One or more memories, including a random-access memory (RAM), a read only memory (ROM), and/or another type of dynamic or static storage device (e.g., a flash memory, a magnetic memory, and/or an optical memory) may store information and/or instructions for use by the user device. The user device may include a memory (e.g., a non-transitory computer-readable medium) capable of storing instructions, that when executed, cause the processor to perform one or more processes and/or methods described herein.

In some implementations, the user device may obtain one or more optical requirements (e.g., from a data structure, from information input by a user via a user interface of the user device, and/or the like) for a structured light device. For example, the optical system requirements may include information concerning a target dot projection (e.g., a target dot pattern of each tile that comprises the dot projection, a target number of dots of the dot projection, and/or the like), information concerning a target operating current (Iop), information concerning a target output optical power for the Top (Pop), information concerning a target range for a number of emitters of the VCSEL array, information concerning a target tilt angle range of an emitter pattern of the VCSEL, array information concerning a target chip size (e.g., an active area, one or more dimensions, and/or the like of a chip that includes the VCSEL array), information concerning a target FOV of the DOE (e.g., an angular size of an FOV), information concerning a target aspect ratio of the DOE (e.g., a number of rows and/or columns of an emitter pattern that the DOE optically projects), and/or the like. Accordingly, the user device may adjust, design, and/or the like, parameters associated with an emitter pattern for a VCSEL array, based on one or more of the optical requirements, to provide an optimal configuration of the emitter pattern for the VCSEL array.

Figure 4A:
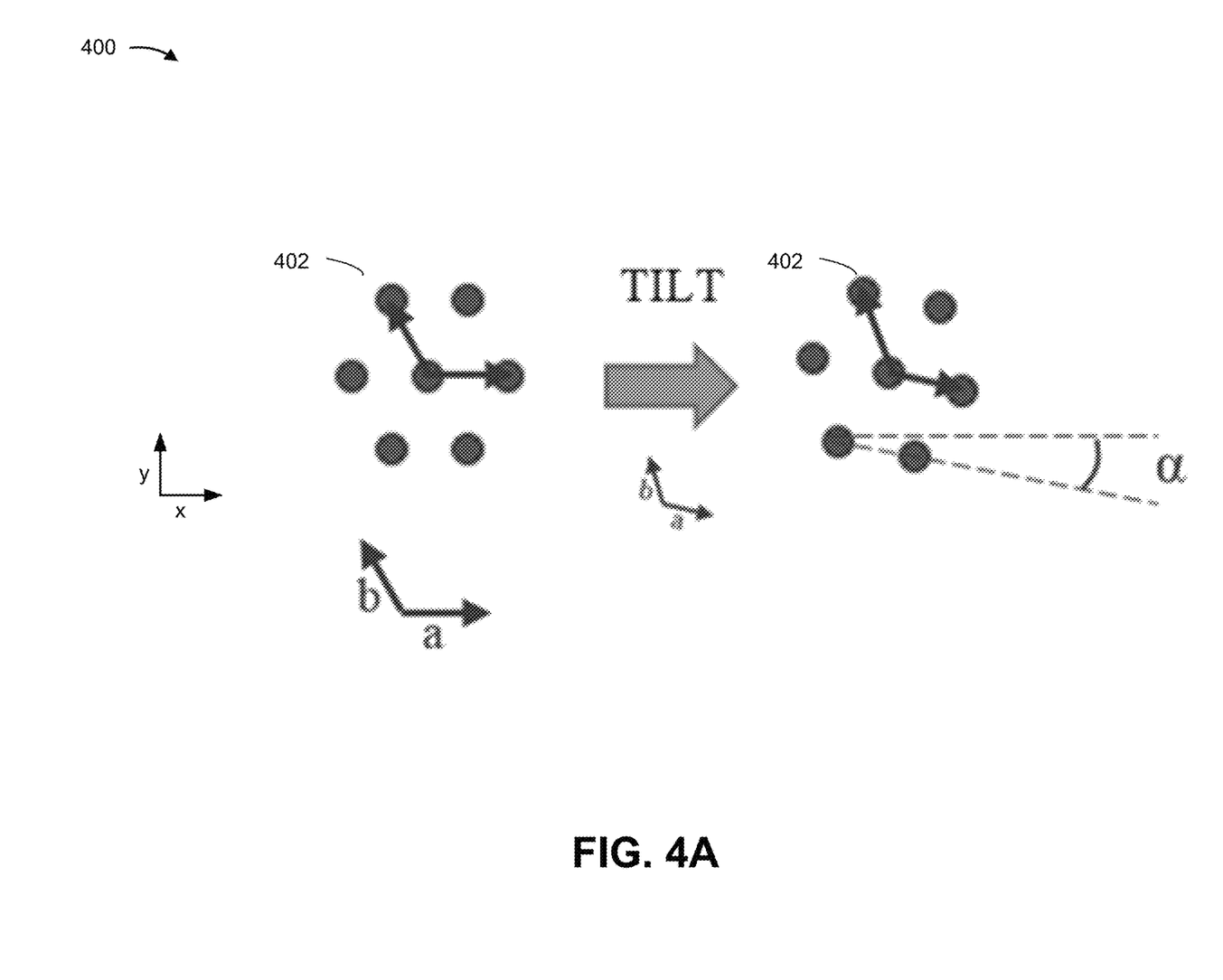
FIGS. 4A-4D are diagrams of an example implementation related to designing an emitter pattern that has a tilt angle for an exemplary VCSEL array described herein.

In some implementations, the user device may determine (e.g., based on one or more of the optical requirements) an emitter pattern for the VCSEL array, such as hexagonal emitter pattern 402 in FIG. 4A For example, the user device may determine the emitter pattern based on the information concerning the target dot projection, the information concerning the target range for the number of emitters of VCSEL array, the information concerning the target tilt angle of the emitter pattern of the VCSEL array, the information concerning the target chip size, the information concerning the target FOV, and/or the like. The emitter pattern may include a plurality of emitters. For example, the hexagonal emitter pattern 402 shown in FIG. 4A includes seven emitters. As shown on the left side of FIG. 4A, the hexagonal emitter pattern 402 may have zero-degree tilt angle. As shown on the right side of FIG. 4A, the hexagonal emitter pattern 402 may have tilt angle $\alpha$ (shown in FIG. 4A as 11 degrees, but $\alpha$ may be any non-zero angle within a range, such as 9 to 13 degrees). The user device may determine the tilt angle based on the information concerning the target angle range specified by the optical requirements. As also shown in FIG. 4A, positions of emitters in the hexagonal emitter pattern 402 (e.g., when the hexagonal emitter pattern 402 has a zero-degree tilt angle or an a tilt angle) may be expressed by a and b vectors for any pitch and/or any tilt angle $\alpha$.

In some implementations, the emitter pattern may be a hexagonal emitter pattern that includes one or more instances of the hexagonal emitter pattern 402 arranged next to each other (e.g. wherein emitters of the one or more instances of the hexagonal emitter pattern 402 are aligned and consistently spaced). Such a hexagonal emitter pattern may provide a compact VCSEL array while maintaining a maximum spacing between emitters of the hexagonal emitter pattern. Additionally, or alternatively, the emitter pattern may conform to another pattern, such as a square pattern, a rectangular pattern, an octagonal pattern, and/or the like.

Figure 4B:
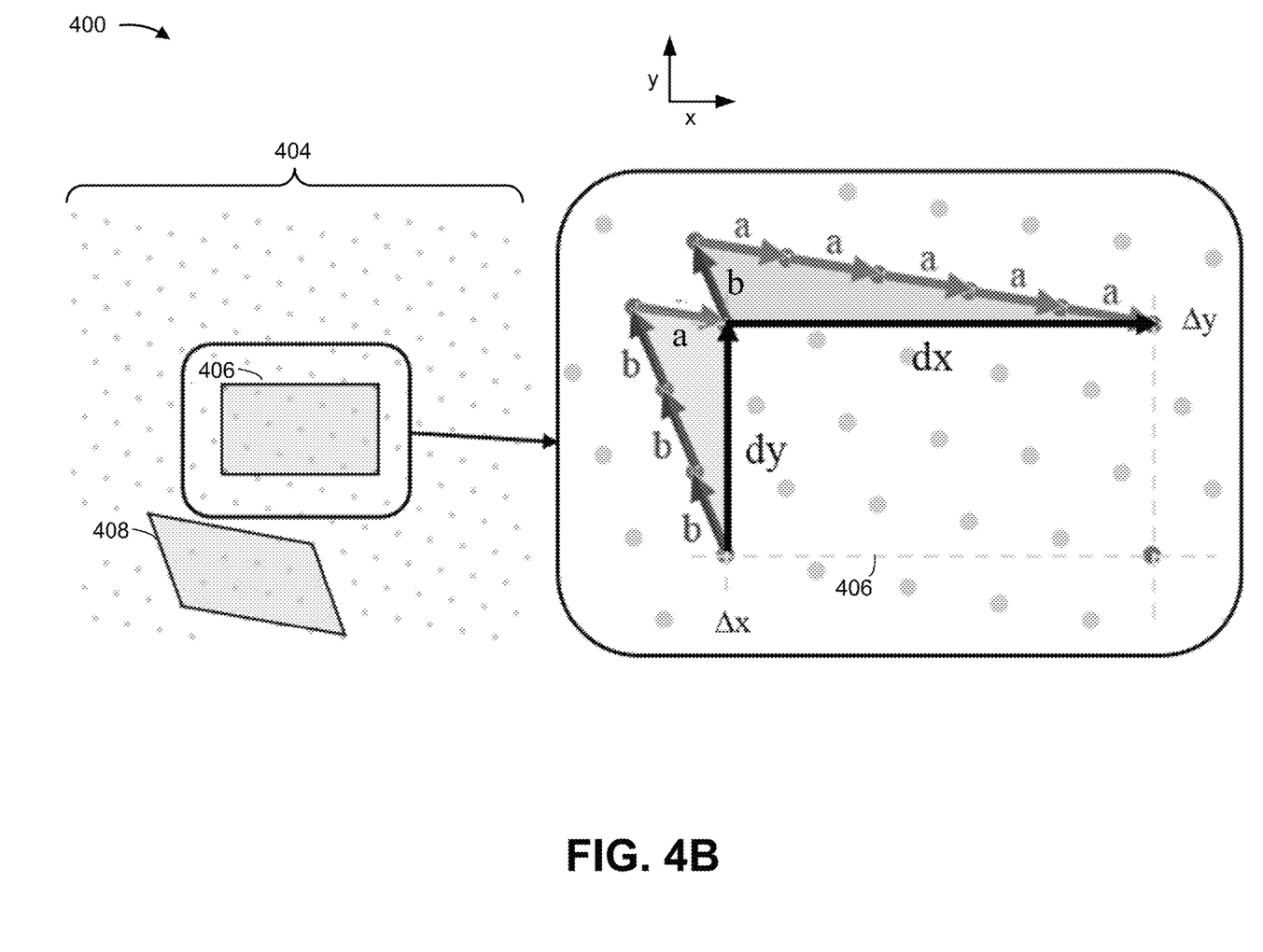
Figure 4C:
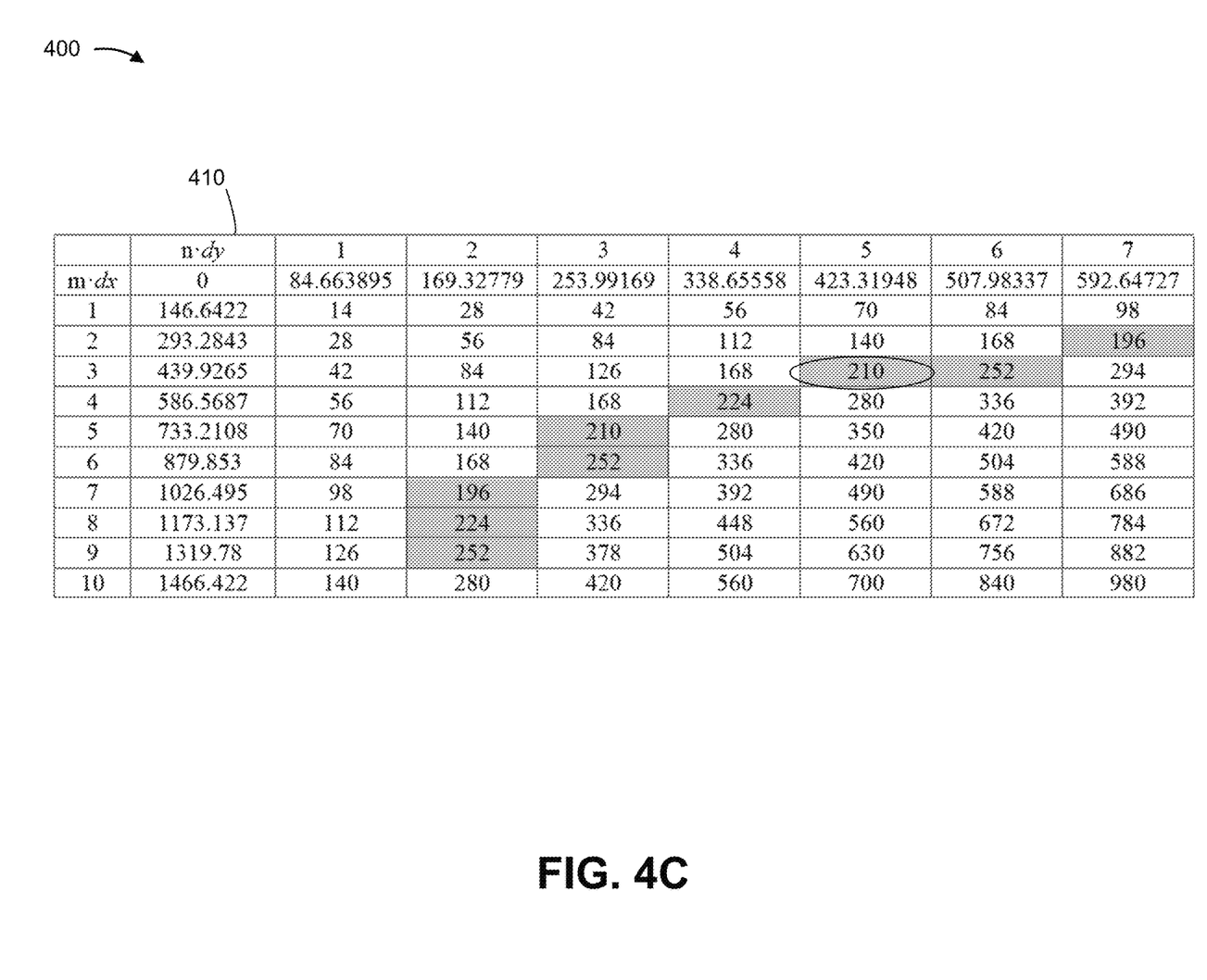

In some implementations, the user device may determine a unit cell of emitters to be able to determine an emitter pattern of a VCSEL array. A unit cell may include a plurality of emitters wherein placement of an emitter, of the plurality of emitters, in a layout of the unit cell in relation to each of the other emitters, of the plurality of emitters, may be expressed as a combination of a first vector and a second vector. For example, FIG. 4B shows an emitter pattern 404 of a 210-emitter VCSEL array of a structured light device, wherein the emitter pattern 404 is a hexagonal emitter pattern and has an eleven degree tilt. A magnified view of a portion of the emitter pattern 404 in FIG. 4B shows a unit cell 406. The unit cell 406 comprises seventeen emitters within a rectangular bounding box. As shown in FIG. 4B, placement of an emitter in a layout of the unit cell 406 in relation to another emitter in the layout of the unit cell may be expressed by a combination of an a vector and a b vector (e.g., vectors representing shortest paths between dots of the emitter pattern 404).

In some implementations, the user device may determine bounds of a unit cell by identifying a combination of the first vector and the second vector that expresses a difference in placement of emitters that have a same x-coordinate or a same y-coordinate (or some other similar coordinate). For example, as shown in FIG. 4B, the user device may determine the borders of the unit cell 406 that can be expressed by a difference in placement of emitters that have a same x-coordinate (hereinafter referred to as dy), which is represented by 3b×1a (e.g., a total distance in they-direction represented by 3 times the b vector and 1 times the a vector), and a difference in placement of emitters that have a same y-coordinate (hereinafter referred to as dr), which is represented to 1b×5a (e.g., a total distance in the x-direction represented by 1 times the b vector and 5 times the a vector). As another example, the user device may determine borders of a unit cell 408 using a similar process, wherein the borders of the unit cell 408 can be expressed as 3b×5a (e.g., a total distance in they-direction represented by 3 times the b vector and a total distance in the x-direction represented by 5 times the a vector).

In some implementations, the user device may determine an emitter pattern of a VCSEL array based on determining a unit cell. For example, the user device may arrange two or more unit cells (e.g., copies of the same unit cell, such that each copy has the same number of emitters, the same layout, the same spacing, and/or the like) to form the emitter pattern so that the unit cells are adjacent to each other (e.g., in rows, columns, and/or the like, such that the copies of the unit cell are placed next to each other, consistently spaced from one another, do not overlap each other, and/or the like). Accordingly, a placement of an emitter in a first unit cell, of the two or more unit cells that form the emitter pattern, in relation to a corresponding emitter of a second unit cell, of the two or more unit cells, may be expressed as a combination of dx and/or dy.

In some implementations an alignment error may be associated with two adjacent unit cells of the emitter pattern. For example, as shown in FIG. 4B, Δx may represent an amount of misalignment between adjacent unit cells 406 along the y-axis (e.g., an amount of error associated with dy) and/or Δy may represent an amount of misalignment between adjacent unit cells 406 along the x-axis (e.g., an amount of error associated with dx). In other words, Δx and Δy represent unit cell placement errors when the sums of a and b vectors don't add up to an exact dy or dx shift for a given tilt angle. In some implementations, the user device may determine a unit cell and/or an emitter pattern such that the amount of misalignment between adjacent unit cells of the emitter pattern is minimized. For example, the user device may determine a unit cell and/or an emitter pattern such that Δx satisfies (e.g., is less than or equal to) any-axis misalignment threshold and/or Δy satisfies (e.g., is less than or equal to) an x-axis misalignment threshold. In some implementations, the x-axis misalignment threshold and/or the y-axis misalignment threshold may be 5 nanometers (nm), 10 nm, 20 nm, 50 nm, and/or the like.

In some implementations, the user device may adjust (e.g., in association with determining the unit cell and/or the emitter pattern) the tilt angle of the emitter pattern to minimize the amount of misalignment between adjacent unit cells. For example, the user device may adjust a target tilt angle of 11 degrees (e.g., indicated by the optical requirements obtained by the user device) to a tilt angle of 10.89 degrees to yield a lower amount of misalignment than the amount of misalignment achieved with 11 degrees.

In some implementations, the user device may determine a number of unit cells to arrange along the x-axis and/or the y-axis to form the emitter pattern such that the emitter pattern has an aspect ratio, a number of emitters, and/or the like that satisfy the optical requirements. For example, FIG. 4C includes a table 410 that identifies a number of emitters for an emitter pattern based on numbers of multiples (e.g., m columns and n rows) of a unit cell (e.g., with bounds defined by dx and dy) that includes 14 emitters. Stated differently, table 410 provides discrete number solutions for a number of emitters of an emitter pattern based on number of unit cells forming the emitter pattern, where dx and dy represent a size of the unit cell (e.g., in microns). Shaded solutions correspond to a number of emitters falling within the range of 172 emitters to 257 emitters, which may be an optimal range of emitters for a particular implementation.

In some implementations, the user device selects a number of emitters from the discrete solutions of table 410 based on aspect ratios of the discrete solutions and/or an aspect ratio of an active area size (e.g., a chip size) of the VCSEL array. For example, the optical requirements may indicate an active area size (e.g., a chip size, represented by X×Y) in a range of approximately 500 microns by 500 microns, which corresponds to an aspect ratio (X/Y) of approximately one. Thus, in such an example and as indicated by the oval in FIG. 4C, the user device may select a discrete solution for m=3 and n=5, which yields 210 emitters (e.g., 3×5×14 emitters) and an active area of X=439.9265 microns and Y=423.31948 microns (e.g., such that the aspect ratio X/Y is approximately one). As shown in Table 410, the other shaded solutions yield an active area outside of the range provided by the optical requirements (e.g., X or Y ranges greater than 500 microns). Accordingly, other numbers of emitters and/or active area sizes may lead to vertical and/or horizontal misalignment, gaps of projected dots, and/or overlap of projected dots. In this way, the user device may determine an optimal emitter pattern associated with a target tilt angle that includes a total number of emitters that are within a target range for a number of emitters (e.g., the total number of emitters of the emitter pattern is greater than or equal to a minimum number of emitters and less than or equal to a maximum number of emitters), that conforms to a target aspect ratio, and/or the like, of the structured light device.

In some implementations, the user device may adjust the aspect ratio of the emitter pattern (e.g., an X×Y active area of a VCSEL chip) to address an optical requirement of a lens and/or a DOE of the structured light device. For example, the DOE may have an FOV of 60×78 degrees for a dot projection comprising an aspect ratio of 5×7 tiles and the user device may determine that an optimal chip aspect ratio equals (60/5)/(78/7), or approximately 1.08.

Figure 4D:
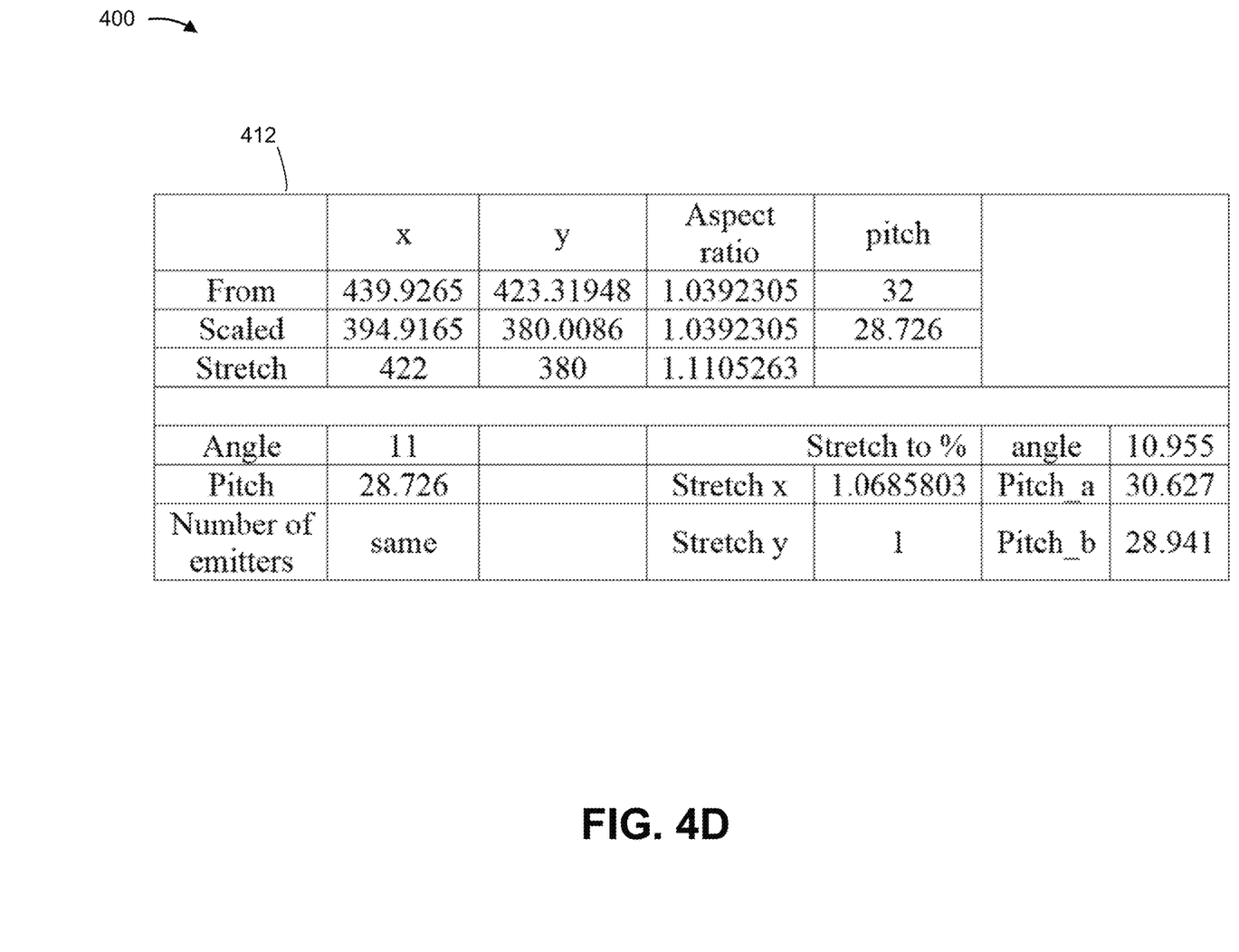

In some implementations, the user device may adjust pitch in the emitter pattern and/or may scale (e.g., stretch or shrink), in the x and/or y direction, the emitter pattern to adjust the emitter pattern to comply with the optimal chip aspect ratio. FIG. 4D includes a table 412 that demonstrates an example of the user device adjusting pitch (e.g., with an original emitter pitch of 32 microns) in the emitter pattern and stretching the emitter pattern (e.g., with an original active area size of 439.9265 microns×423.31948 microns and an original aspect ratio of 1.0392305) to a target active area size (e.g., 422 microns×380 microns) and a target aspect ratio (e.g., approximately 1.11). In this example, the user device may adjust the pitch of the emitter pattern from 32 microns to 28.7 microns (e.g., to uniformly shrink the unit cells that form the emitter pattern), which may cause the target active area size to reduce to 394.9165 microns× 380.0086 microns. The user device may then stretch the emitter pattern in the x-direction from 394.9165 microns to 422 microns, to obtain the target active area size (e.g., 422 microns×380 microns) and the target aspect ratio (e.g., approximately 1.11).

As further shown in table 412, this may result in a pitch in the emitter pattern that differs in the x and y directions. (e.g., the pitch in the x direction has one value and the pitch in the y direction has a different value). For example, the length of the a vector may be changed from 28.726 microns to 30.627 microns, and the length of the b vector may be changed from 28.726 microns to 28.941 microns. As additionally shown, the tilt angle associated with the emitter pattern may be adjusted, from 11 degrees to 10.955 degrees, as a result of adjusting the pitch and/or stretching the emitter pattern.

In this way, the user device may iteratively adjust one or more parameters associated with an emitter pattern for a VCSEL array to design an optical emitter pattern for a lens and/or a DOE of a structured light device to emit a dot projection comprising a plurality of tiles, wherein corresponding dots of each tile of the dot projection are aligned and/or consistently spaced.

As indicated above, FIGS. 4A-4D are provided as an example. Other examples may differ from what is described with regard to FIGS. 4A-4D.

Figure 5:
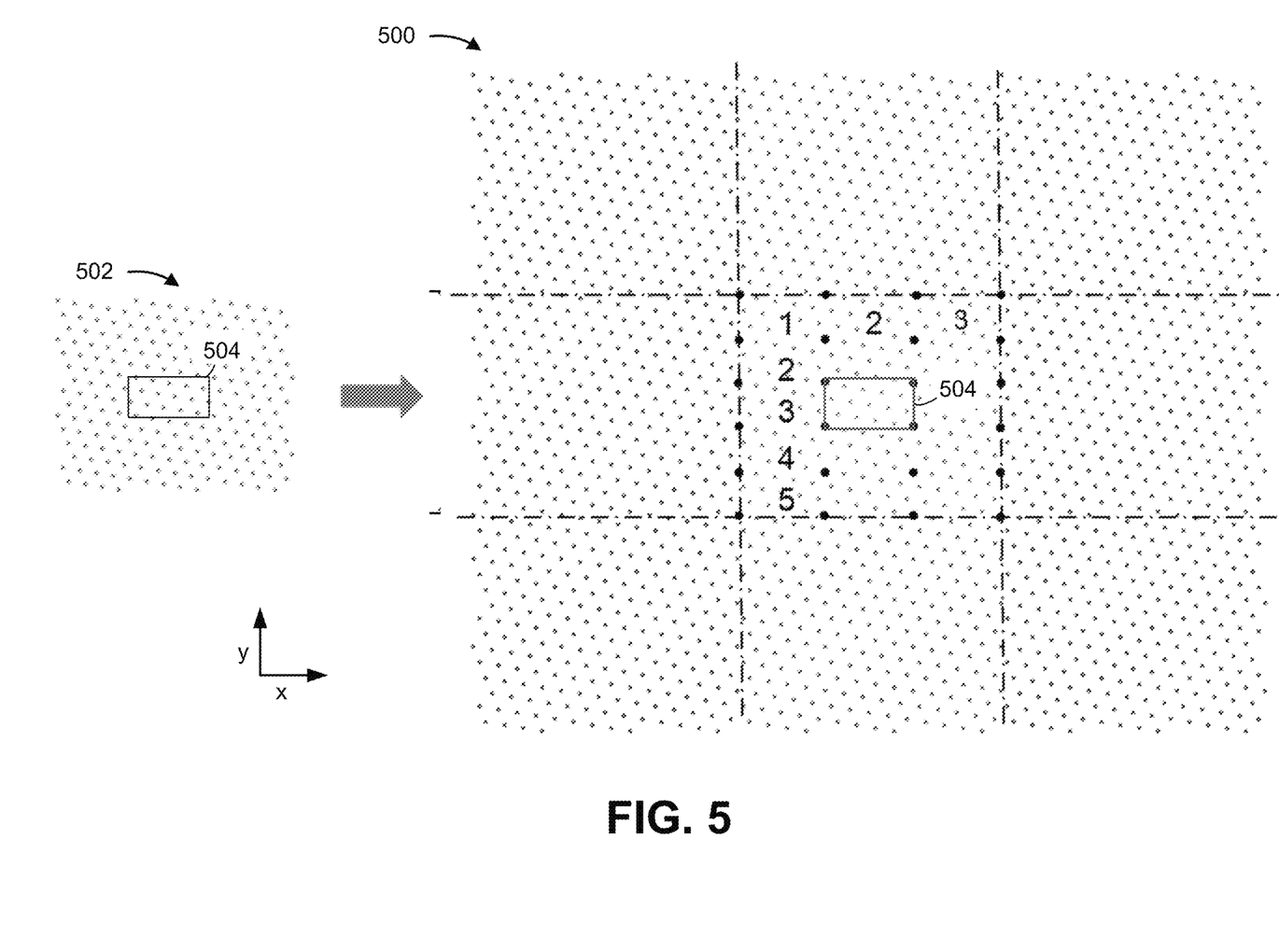
FIG. 5 is a diagram of an example dot projection associated with an exemplary VCSEL array described herein that has an emitter pattern with a tilt angle.

FIG. 5 is a diagram of an example dot projection 500 associated with an exemplary 210-emitter VCSEL array of a structured light device, wherein an emitter pattern 502 (e.g., an optimal emitter pattern that was designed using the user device, as described herein in relation to FIGS. 4A-4D) of the exemplary 210-emitter VCSEL array has an 11-degree tilt angle. As shown in FIG. 5, the example dot projection 500 is a 3×3 optical projection of the emitter pattern 502 (e.g., the emitter pattern may be optically projected to form nine tiles, approximately identified by dashed lines, arranged in a three row and three column tile pattern).

Accordingly, each tile of the example dot projection 500 may include a plurality of dots that conforms to a dot pattern (e.g., that corresponds to the emitter pattern 502), wherein each dot of the dot pattern is respectively associated with an emitter of the emitter pattern 502. In some implementations, when a placement of a first emitter in the emitter pattern 502 in relation to a second emitter in the emitter pattern 502 can be expressed as a combination of vectors (e.g., the a and b vectors described herein), a placement of a first dot in the dot pattern (e.g., that corresponds to the first emitter) in relation to a second dot in the dot pattern (e.g., that corresponds to the second emitter) can be expressed as a combination of the same vectors (e.g., the a and b vectors multiplied by respective constants associated with the example dot projection 500).

As further shown in FIG. 5, each tile of the example dot projection 500 comprises multiple repetitions of a unit cell 504 that comprises the emitter pattern 502. For example, a middle tile of the example dot projection 500 comprises five rows and three columns of repetitions of the unit cell 504 (e.g., based on a 5×3 design of the emitter pattern 502). As further shown in FIG. 5, the tiles of the example dot projection 500 do not overlap one another and are placed adjacent one another to form a seamless dot pattern.

As indicated above, FIG. 5 is provided as an example. Other examples may differ from what is described with regard to FIG. 5

Figure 6:
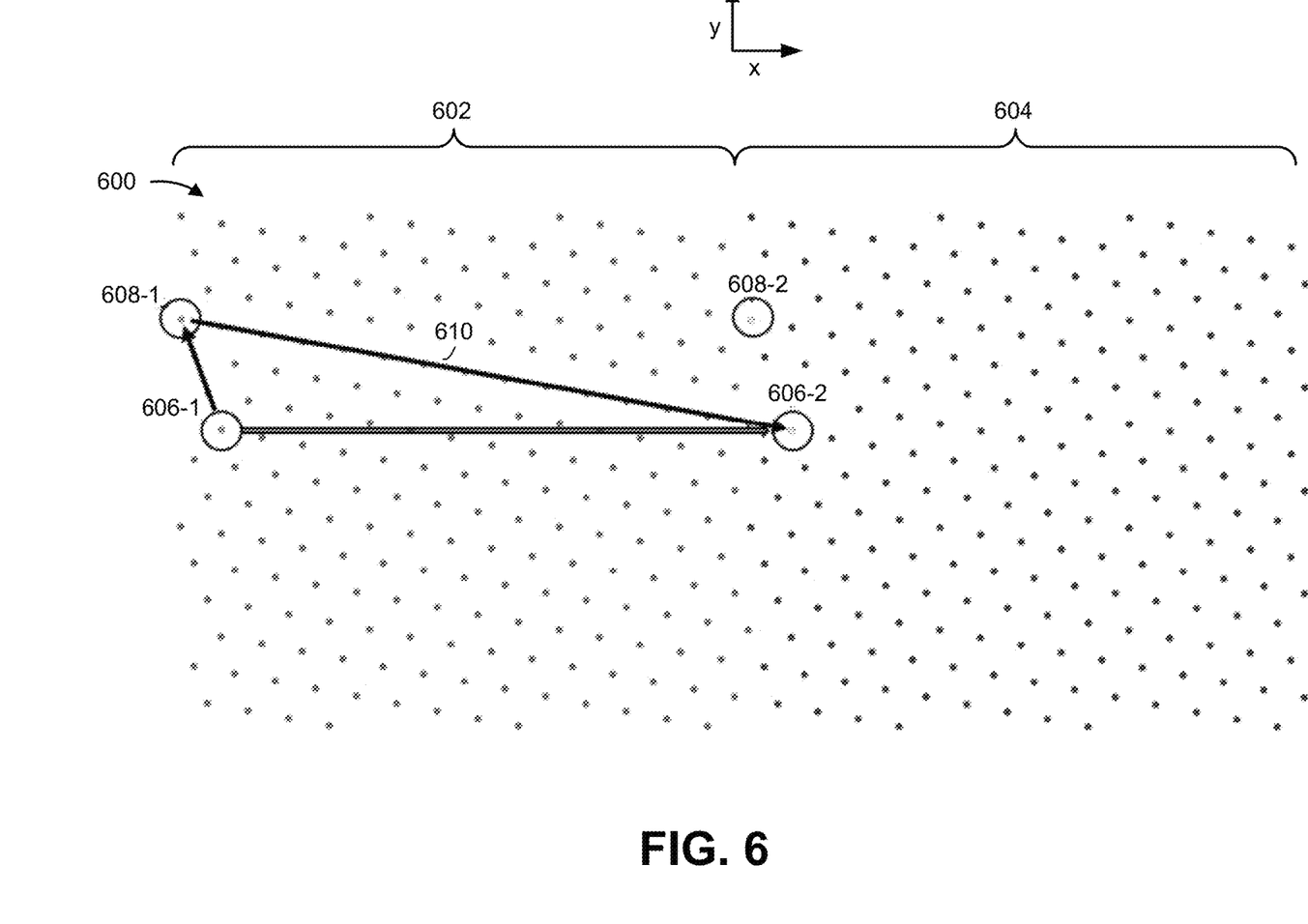
FIG. 6 is a diagram of another example dot projection associated with an exemplary VCSEL array described herein that has an emitter pattern with a tilt angle.

FIG. 6 is a diagram of an example dot projection 600 associated with an exemplary 210-emitter VCSEL array of a structured light device, wherein an emitter pattern (e.g., an optimal emitter pattern, not shown, that was designed using the user device, as described herein in relation to FIGS. 4A-4D) of the 210-emitter VCSEL array is a hexagonal emitter pattern and has an eleven degree tilt As shown in FIG. 6, the example dot projection 600 is a 1×2 optical projection of the emitter pattern (e.g., the emitter pattern may be optically projected to form two tiles arranged in a row).

As further shown in FIG. 6, a first tile 602 of the example dot projection 600 (e.g., that includes the light dots of the example dot projection 600) may be a first optical projection of the emitter pattern, and a second tile 604 of the example dot projection 600 (e.g., that includes the dark dots of the example dot projection 600) may be a second optical projection of the emitter pattern. For example, a DOE of the structured light device may perform an optical translation operation of the emitter pattern along an axis (e.g., the x-axis shown in FIG. 6) to cause the first tile 602 of the example dot projection 600 to be projected next to the second tile 604 of the example dot projection 600 along the axis. As further shown in FIG. 6, in such an example, a dot 606-1 of the first tile 602 may have a same y-coordinate as a corresponding dot 606-2 of the second tile 604, a dot 608-1 of the first tile 602 may have a same y-coordinate as a corresponding dot 608-2 of the second tile 604, and so on.

As another example, the DOE may perform an optical translation operation of the emitter pattern along a different axis (e.g., they-axis). In such an example, a dot of the first tile 602 may have a same x-coordinate as a corresponding dot in the second tile 604. Additionally, or alternatively, the DOE may perform multiple optical translation operations of the emitter pattern along the x-axis, the y-axis, and/or another axis. For example, the DOE may perform an optical translation operation of the emitter pattern to generate one or more tiles (e.g., wherein each tile conforms to a dot pattern that is an optical projection of the emitter pattern) that are tiled adjacent each other to form a dot projection.

In some implementations, the lens and/or the DOE may be configured to generate a dot projection comprising a plurality of tiles, such that an amount of misalignment between adjacent tiles of the dot projection is minimized. For example, the DOE may cause the plurality of tiles to be arranged to cause a measurement of tile misalignment (e.g., in the x-direction, the y-direction, and/or the like) associated with two adjacent tiles, of the plurality of tiles, to satisfy (e.g., be less than or equal to) a tile misalignment threshold. In some implementations, the tile misalignment threshold may be 1 μm, 3 μm, 10 μm, 20 μm, 50 μm, 100 μm and/or the like. In this way, the DOE may be configured to ensure that dots of the dot projection are aligned and/or consistently spaced. For example, as shown in FIG. 6, a line 610 that connects dot 608-of the first tile 602 and dot 606-2 of the second tile 604 passes through other dots of the first tile 602, which indicates that the first tile 602 and the second tile 604 are well-aligned (e.g., a measurement of tile misalignment between the first tile 602 and the second tile 604 satisfies the tile misalignment threshold).

As indicated above, FIG. 6 is provided as an example. Other examples may differ from what is described with regard to FIG. 6.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical-cavity surface-emitting laser (VCSEL) array, comprising:
    a semiconductor substrate; and
    a plurality of emitters on the substrate that conforms to an emitter pattern,
        wherein the emitter pattern is oriented at a non-zero angle to a rectilinear axis of a diffractive optical element (DOE),
            wherein the rectilinear axis is perpendicular to an optical axis of the DOE and horizontally or vertically aligned with a reference edge of a chip of the VCSEL array,
        wherein the emitter pattern comprises two or more unit cells arranged to form the emitter pattern,
            wherein each unit cell, of the two or more unit cells, includes a same number of emitters, and
            wherein the two or more unit cells are arranged to cause a measurement of misalignment associated with two adjacent unit cells, of the two or more unit cells, to satisfy a misalignment threshold; and
    the DOE configured to generate a dot projection from light emitted by the plurality of emitters of the VCSEL array,
        wherein the dot projection comprises a plurality of tiles.

2. The VCSEL array of claim 1, wherein the non-zero angle is between 5 degrees and 20 degrees.

3. The VCSEL array of claim 1, wherein a placement of an emitter in a first unit cell, of the two or more unit cells, in relation to a corresponding emitter of a second unit cell, of the two or more unit cells, is expressed as a combination of a first unit cell placement vector and a second unit cell placement vector.

4. The VCSEL array of claim 3, wherein the measurement of misalignment measures at least one of:
    an amount of error associated with the first unit cell placement vector, or
    an amount of error associated with the second unit cell placement vector.

5. The VCSEL array of claim 1, wherein the misalignment threshold is 1000 nm.

6. The VCSEL array of claim 1,
    wherein each tile, of the plurality of tiles, comprises a plurality of dots that conforms to a dot pattern, and
        wherein the dot pattern is an optical projection of the emitter pattern.

7. A structured light system, comprising:
    a vertical-cavity surface-emitting laser (VCSEL) array that comprises a plurality of emitters that conforms to an emitter pattern,
        wherein the emitter pattern is oriented at a non-zero angle to a rectilinear axis of a diffractive optical element (DOE),
            wherein the rectilinear axis is perpendicular to an optical axis of the DOE and horizontally or vertically aligned with a reference edge of a chip of the VCSEL array,
        wherein the emitter pattern comprises two or more unit cells arranged to form the emitter pattern,
            wherein each unit cell, of the two or more unit cells, includes a same number of emitters, and
            wherein the two or more unit cells are arranged to cause a measurement of unit cell misalignment associated with two adjacent unit cells, of the two or more unit cells, to satisfy a unit cell misalignment threshold; and
    the DOE configured to generate a dot projection from light emitted by the plurality of emitters of the VCSEL array,
        wherein the dot projection comprises a plurality of tiles.

8. The structured light system of claim 7, wherein an aspect ratio associated with the emitter pattern is a combination of an aspect ratio of the DOE and a field of view of the DOE.

9. The structured light system of claim 7, wherein each tile, of the plurality of tiles, comprises a plurality of dots that conforms to a dot pattern,
    wherein each dot of the dot pattern is respectively associated with an emitter of the emitter pattern.

10. The structured light system of claim 7, wherein each tile, of the plurality of tiles, comprises a plurality of dots that conforms to a dot pattern,
    wherein the dot pattern is an optical projection of the emitter pattern.

11. The structured light system of claim 7, wherein the plurality of tiles do not overlap.

12. The structured light system of claim 7, wherein the plurality of tiles are arranged to cause a measurement of tile misalignment associated with two adjacent tiles, of the plurality of tiles, to satisfy a tile misalignment threshold.

13. The structured light system of claim 7, further comprising:

a lens configured to collimate the light emitted by the plurality of emitters of the VCSEL array and direct the light to the DOE.

14. The structured light system of claim 7, wherein an emitter pitch associated with the emitter pattern differs between an x-direction and a y-direction.

15. A structured light system, comprising:
a vertical-cavity surface-emitting laser (VCSEL) array that comprises a plurality of emitters that conforms to an emitter pattern,
  wherein the emitter pattern is oriented at a non-zero angle to a rectilinear axis of a diffractive optical element (DOE),
    wherein the rectilinear axis is perpendicular to an optical axis of the DOE and horizontally or vertically aligned with a reference edge of a chip of the VCSEL array,
  wherein the emitter pattern comprises two or more unit cells arranged to form the emitter pattern,
    wherein each unit cell, of the two or more unit cells, includes a same number of emitters, and
    wherein the two or more unit cells are arranged to cause a measurement of unit cell misalignment associated with two adjacent unit cells, of the two or more unit cells, to satisfy a unit cell misalignment threshold; and
the DOE configured to generate a dot projection from light emitted by the plurality of emitters of the VCSEL array,
  wherein the dot projection comprises a plurality of tiles, and
    wherein the plurality of tiles are arranged to cause a measurement of tile misalignment to satisfy a tile misalignment threshold.

16. The structured light system of claim 15, wherein each tile, of the plurality of tiles, comprises a plurality of dots, and
a number of emitters of the VCSEL array equals a respective number of dots of the plurality of tiles.

17. The structured light system of claim 15, wherein each tile, of the plurality of tiles, comprises a plurality of dots that conforms to a dot pattern,
wherein the dot pattern corresponds to the emitter pattern.

18. The structured light system of claim 15, wherein a tile, of the plurality of tiles, comprises a plurality of dots that conforms to a dot pattern, and wherein:
a placement of a first dot in relation to a second dot in the dot pattern corresponds to a placement of a first emitter in relation to a second emitter in the emitter pattern, and
the first dot corresponds to the first emitter and the second dot corresponds to the second dot.

19. The structured light system of claim 15, wherein an emitter pitch associated with the emitter pattern differs between an x-direction and a y-direction.

20. The structured light system of claim 15, wherein the measurement of tile misalignment measures an amount of misalignment between adjacent tiles of the plurality of tiles.

* * * * *